United States Patent
Wei et al.

(10) Patent No.: US 11,749,502 B2
(45) Date of Patent: Sep. 5, 2023

(54) SYSTEM AND METHOD FOR PULSE MODULATION OF RADIO FREQUENCY POWER SUPPLY AND REACTION CHAMBER THEREOF

(71) Applicant: BEIJING NAURA MICROELECTRONICS EQUIPMENT CO., LTD., Beijing (CN)

(72) Inventors: Gang Wei, Beijing (CN); Jing Wei, Beijing (CN); Jing Yang, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 318 days.

(21) Appl. No.: 17/095,278

(22) Filed: Nov. 11, 2020

(65) Prior Publication Data
US 2021/0066041 A1    Mar. 4, 2021

Related U.S. Application Data

(63) Continuation of application No. PCT/CN2019/083470, filed on Apr. 19, 2019.

(30) Foreign Application Priority Data

May 17, 2018 (CN) .......................... 201810474665.4

(51) Int. Cl.
   *H01J 37/32* (2006.01)
   *H05H 1/46* (2006.01)

(52) U.S. Cl.
   CPC .. *H01J 37/32155* (2013.01); *H01J 37/32183* (2013.01); *H05H 1/46* (2013.01); *H05H 2242/26* (2021.05)

(58) Field of Classification Search
   None
   See application file for complete search history.

(56) References Cited

U.S. PATENT DOCUMENTS 5,451,956 A * 9/1995 Lochhead ................ G01S 7/36
                                                324/76.38
5,838,210 A * 11/1998 Midya .................... H04L 27/00
                                                332/107
(Continued)

FOREIGN PATENT DOCUMENTS

CN    102647845 A    8/2012
CN    103903944 A    7/2014
(Continued)

OTHER PUBLICATIONS

World Intelectual Property Organization (WIPO) International Search Report for PCT/CN2019/083470 dated May 30, 2019 5 Pages.

*Primary Examiner* — Srinivas Sathiraju
(74) *Attorney, Agent, or Firm* — ANOVA LAW GROUP, PLLC

(57) ABSTRACT

A pulse modulation system of a radio frequency (RF) power supply includes a modulation output circuit and a frequency adjustment circuit. The modulation output circuit is configured to modulate an output signal of the RF power supply and output a pulse modulation RF signal. Each pulse cycle of the pulse modulation RF signal includes a pulse-on phase and a pulse-off phase. An overshoot sub-phase is set in an initial preset time of the pulse-on phase. The frequency adjustment circuit is electrically connected to the modulation output circuit. The frequency adjustment circuit is configured to adjust an RF frequency of the pulse modulation RF signal of the overshoot sub-phase to cause a (Continued)

reflected power of the overshoot sub-phase to satisfy a preset reflected power or a reflected coefficient to satisfy a preset reflected coefficient.

19 Claims, 6 Drawing Sheets

(56) References Cited

U.S. PATENT DOCUMENTS

| | | | | |
|---|---|---|---|---|
| 5,849,136 A * | 12/1998 | Mintz | ............... | H01J 37/32183 |
| | | | | 315/111.21 |
| 5,968,377 A * | 10/1999 | Yuasa | ............... | H01J 37/32027 |
| | | | | 204/192.12 |
| 6,193,855 B1 | 2/2001 | Gopalraja | ............. | C23C 14/345 |
| | | | | 204/192.12 |
| 6,947,300 B2 * | 9/2005 | Pai | ........................ | H02M 7/493 |
| | | | | 363/71 |
| 8,129,653 B2 * | 3/2012 | Kirchmeier | ............ | G01R 21/06 |
| | | | | 219/121.36 |
| 9,306,533 B1 * | 4/2016 | Mavretic | ........... | H01J 37/32183 |
| 9,577,516 B1 * | 2/2017 | Van Zyl | .................. | H03F 3/245 |
| 9,960,763 B2 * | 5/2018 | Miller | ...................... | H03K 3/57 |
| 10,027,314 B2 * | 7/2018 | Prager | ..................... | H03K 5/12 |
| 10,074,518 B2 * | 9/2018 | Van Zyl | ...................... | H02J 9/00 |
| 10,224,822 B2 * | 3/2019 | Miller | ............... | H02M 3/33523 |
| 10,460,911 B2 * | 10/2019 | Ziemba | ................ | H01J 37/3467 |
| 10,483,089 B2 * | 11/2019 | Ziemba | ........... | H01J 37/32146 |
| 10,607,813 B2 * | 3/2020 | Fairbairn | ............. | C23C 16/509 |
| 10,622,197 B2 * | 4/2020 | Kubota | ............ | H01J 37/32302 |
| 10,666,198 B2 * | 5/2020 | Prager | ..................... | H03B 9/143 |
| 10,707,062 B2 * | 7/2020 | Brandon | ........... | H01J 37/32944 |
| 10,791,617 B2 * | 9/2020 | Dorf | ..................... | C23C 16/505 |
| 11,114,279 B2 * | 9/2021 | Oliveti | ............. | H01J 37/32183 |
| 11,284,500 B2 * | 3/2022 | Dorf | ................ | H01J 37/32174 |
| 11,462,388 B2 * | 10/2022 | Dorf | ................... | H01L 21/3065 |
| 11,462,389 B2 * | 10/2022 | Dorf | ................ | H01J 37/32146 |
| 2005/0152159 A1 * | 7/2005 | Isurin | ............... | H02M 3/33576 |
| | | | | 363/17 |
| 2007/0076344 A1 * | 4/2007 | Hamaishi | ................ | H02M 7/48 |
| | | | | 361/225 |
| 2007/0107844 A1 * | 5/2007 | Bullock | ........... | H01J 37/32174 |
| | | | | 156/345.28 |
| 2007/0184795 A1 * | 8/2007 | Drogi | .................... | H03G 3/004 |
| | | | | 455/127.1 |
| 2011/0167808 A1 * | 7/2011 | Kosaka | ..................... | F01N 3/08 |
| | | | | 60/272 |
| 2011/0254636 A1 * | 10/2011 | Chen | ........................ | H03K 7/08 |
| | | | | 332/108 |
| 2012/0002755 A1 * | 1/2012 | Chen | ........................ | H03K 7/08 |
| | | | | 375/302 |
| 2012/0114083 A1 * | 5/2012 | Chen | .................... | H03G 3/3042 |
| | | | | 375/345 |
| 2013/0175575 A1 * | 7/2013 | Ziemba | ............... | H01L 29/7393 |
| | | | | 257/140 |
| 2015/0084509 A1 * | 3/2015 | Yuzurihara | ............. | H02M 1/08 |
| | | | | 315/111.21 |
| 2015/0256086 A1 * | 9/2015 | Miller | ............... | H02M 3/33523 |
| | | | | 363/21.01 |
| 2015/0318846 A1 * | 11/2015 | Prager | ...................... | H03K 3/57 |
| | | | | 327/304 |
| 2016/0020072 A1 * | 1/2016 | Brouk | ............ | H01J 37/32174 |
| | | | | 156/345.28 |
| 2016/0093471 A1 * | 3/2016 | McChesney | ...... | H01J 37/32183 |
| | | | | 315/111.21 |
| 2016/0241234 A1 * | 8/2016 | Mavretic | .................. | H03H 7/40 |
| 2016/0327029 A1 * | 11/2016 | Ziemba | ................ | F03H 1/0087 |
| 2017/0040143 A1 * | 2/2017 | Ohgoshi | ........... | H01J 37/32192 |
| 2017/0054854 A1 * | 2/2017 | Richards | ........... | H04M 15/8228 |
| 2017/0243723 A1 | 8/2017 | Van | | |
| 2017/0243731 A1 * | 8/2017 | Ziemba | ................ | H01J 65/048 |
| 2017/0294842 A1 * | 10/2017 | Miller | ..................... | H02M 1/08 |
| 2017/0311431 A1 * | 10/2017 | Park | ..................... | H01J 37/3211 |
| 2018/0286636 A1 * | 10/2018 | Ziemba | ............. | H01J 37/32146 |
| 2018/0308663 A1 * | 10/2018 | Collins | ............. | H01J 37/32137 |
| 2019/0080884 A1 * | 3/2019 | Ziemba | ............... | H01J 37/3467 |
| 2019/0131110 A1 * | 5/2019 | Ziemba | ................. | H03K 7/08 |
| 2020/0043702 A1 * | 2/2020 | Ziemba | ............. | H01J 37/32348 |
| 2020/0168436 A1 * | 5/2020 | Ziemba | ............. | H01J 37/32146 |
| 2020/0185196 A1 * | 6/2020 | Ye | ..................... | H01J 37/32183 |
| 2021/0066041 A1 * | 3/2021 | Wei | ..................... | H01L 21/3065 |

FOREIGN PATENT DOCUMENTS

| | | | | | |
|---|---|---|---|---|---|
| CN | 103928283 A | 7/2014 | | | |
| CN | 105247967 A | 1/2016 | | | |
| CN | 107924804 A | 4/2018 | | | |
| DE | 202017103327 U1 | 9/2017 | | | |
| JP | 2004128159 A | * | 4/2004 | ........ | H01J 37/32091 |
| JP | 2004160338 A | | 6/2004 | | |
| JP | 2013135159 A | * | 7/2013 | ......... | C23C 16/5096 |
| JP | 2016528667 A | | 9/2016 | | |
| JP | 2017073247 A | | 4/2017 | | |
| KR | 20130077799 A | | 7/2013 | | |
| TW | 201613422 A | | 4/2016 | | |
| TW | 201731349 A | | 9/2017 | | |
| WO | 0219387 A2 | | 3/2002 | | |
| WO | WO-2004032213 A1 | * | 4/2004 | ........ | H01J 37/32091 |
| WO | WO-2013099133 A1 | * | 7/2013 | ......... | C23C 16/5096 |
| WO | WO-2017142695 A1 | * | 8/2017 | ........ | H01J 37/32146 |

* cited by examiner

US 11,749,502 B2

SYSTEM AND METHOD FOR PULSE MODULATION OF RADIO FREQUENCY POWER SUPPLY AND REACTION CHAMBER THEREOF

CROSS-REFERENCES TO RELATED APPLICATIONS

This application is a continuation of International Application No. PCT/CN2019/083470, filed on Apr. 19, 2019, which claims priority to Chinese Application No. 201810474665.4 filed on May 17, 2018, the entire content of all of which are incorporated herein by reference.

TECHNICAL FIELD

The present disclosure generally relates to the semiconductor manufacturing technology field and, more particularly, to a system and method for a pulse modulation of a radio frequency (RF) power supply, and a reaction chamber thereof.

BACKGROUND

Plasma equipment is broadly applied in a preparation process of manufacturing an integrated circuit (IC) or a micro-electro-mechanical system (MEMS) device. The plasma equipment uses radio frequency (RF) power output by an RF power supply to excite a process gas to form a plasma. The plasma equipment includes capacitor coupled plasma (CCP) equipment, inductively coupled plasma (ICP) equipment, and surface wave or electron cyclotron resonator (ECR) equipment. The CCP equipment generates the plasma by using a capacitor coupled method, which has a simple structure and low cost and is easy to generate evenly distributed plasma in a large area. The CCP equipment is suitable for an etching process of a dielectric film. The ECR equipment can obtain plasma with high density under a low pressure, which has a relatively high cost. The ICP equipment not only can obtain the plasma with high density under low pressure but also has a simple structure and a low cost. Moreover, the ICP equipment can separately control an RF source, which is configured to generate and determine the plasma density, and an RF source, which is configured to determine a particle energy incident on a wafer. The ICP equipment is suitable for an etching process of materials of metals and semiconductors.

FIG. 1 is a schematic diagram of an inductively coupled plasma (ICP) equipment according to some embodiments of the present disclosure. The ICP equipment includes a reaction chamber 10. A ceiling wall of the reaction chamber 10 is embedded with a dielectric window 11. An induction coil 12 is arranged on the dielectric window 11. The induction coil 12 is electrically connected to a first RF power supply 14 through a first impedance matching device 13 to excite a process gas to form a plasma in the reaction chamber 10. That is, the first RF power supply 14 is an RF source configured to generate and determine the density of the plasma. An electrostatic chuck 15, which is configured to load a wafer S, is arranged in the reaction chamber 10. The electrostatic chuck 15 is electrically connected to a second RF power supply 17 through a second impedance matching device 16. The electrostatic chuck 15 is configured to attract the plasma to move towards the wafer S to complete processes of deposition, etching, etc., by the plasma to the wafer S. That is, the second RF power supply 17 is an RF source configured to determine particle energy incident to the wafer.

However, the first RF power supply 14 and the second RF power supply 17 in the ICP equipment shown in FIG. 1 are continuous-wave RF power supplies. The continuous wave RF power supply outputs a continuous wave RF signal as shown in FIG. 2. By using the ICP equipment in FIG. 1 to perform an etching process on the wafer, when a feature dimension of the etching process is below 20 nm, the wafer device may be damaged, which may affect the electrical performance of the device. That is plasma induced damage (PID).

To solve the PID problem, at least one of the first RF power supply 14 and the second RF power supply 17 may use the pulse modulation RF power supply. The pulse modulation RF power supply outputs a pulse modulation RF signal as shown in FIG. 3. The pulse modulation RF power supply may modulate an RF signal in time T1 in a pulse-on phase and may not modulate an RF signal in time T2 in a pulse-off phase, and a pulse cycle is T=T1+T2. FIG. 3 shows a wave shape of an ideal pulse modulation RF signal. However, in an actual situation, a certain degree of a power overshoot is needed at the moment the pulse is on. An overshoot sub-phase is set in an initial time of the pulse-on. That is, the pulse modulation RF power supply loads a power overshoot signal (the power may be referred to as the overshoot power). The overshoot power is greater than the power of the RF signal modulated at other moments in T1. The overshoot power is greater than the pulse power and in a certain range, which may ensure a successful ignition of the pulse RF plasma.

Due to an impedance characteristic at the moment of ignition and breakdown of a pulse plasma, higher overshoot power and longer overshoot time are needed for the ignition to succeed. However, in some cases, even the overshoot power is loaded enough, and the overshoot time is long enough, the ignition is difficult to succeed.

SUMMARY

The present disclosure aims to solve at least one of the technical problems existing in the prior art, and proposes a pulse modulation system of a radio frequency (RF) power supply, a pulse modulation method of the RF power supply, and a reaction chamber, which can easily achieve successful ignition, lower the design requirements of the RF system, and reduce the cost.

To solve the above-described problem, one aspect of the present disclosure provides a pulse modulation system of a RF power supply, including a modulation output module and a frequency adjustment module. The modulation output module is configured to modulate an output signal of the RF power supply and output a pulse modulation RF signal, each pulse cycle of the pulse modulation RF signal including a pulse-on phase and a pulse-off phase, and an overshoot sub-phase being set in an initial preset time of the pulse-on phase. The frequency adjustment module is electrically connected to the modulation output module, the frequency adjustment module being configured to adjust an RF frequency of the pulse modulation RF signal of the overshoot sub-phase to cause a reflected power of the overshoot sub-phase to satisfy a preset reflected power or to cause a reflected coefficient to satisfy a preset reflected coefficient.

Preferably, the pulse modulation system further includes an input module. The input module is electrically connected to the frequency adjustment module, the input module being configured to receive an input RF frequency of the pulse modulation RF signal of the overshoot sub-phase and send the input RF frequency to the frequency adjustment module as a preset frequency. The frequency adjustment module is configured to adjust the RF frequency of the pulse modulated RF signal of the overshoot sub-phase to the preset frequency.

Preferably, the frequency adjustment module is configured to use a sweep frequency matching algorithm to automatically adjust the RF frequency of the pulse modulation RF signal of the overshoot sub-phase.

Preferably, the preset reflected coefficient is less than 0.5.

Preferably, the preset reflected coefficient is less than 0.2.

Preferably, a power range of the pulse modulation RF signal of the overshoot sub-phase is 0.5-1 time of a maximum output power of the RF power supply.

Preferably, the power range of the pulse modulation RF signal of the overshoot sub-phase is 0.8-1 time of the maximum output power of the RF power supply.

Preferably, a time length of the overshoot sub-phase is less than or equal to 10% of a time length of the pulse-on phase; and/or a pulse modulation frequency range of the pulse modulation RF signal is from 10 Hz to 100 KHz, and a duty cycle range is from 10% to 90%.

A second aspect of the present disclosure further provides a pulse modulation method of an RF power supply, including the following steps:

outputting a pulse modulation RF signal, each pulse cycle of the pulse modulation RF signal including a pulse-on phase and a pulse-off phase, and an overshoot sub-phase being set in an initial preset time of the pulse-on phase; and in response to outputting the pulse modulation RF signal, adjusting an RF frequency of the pulse modulation RF signal of the overshoot sub-phase to cause a reflected power of the overshoot sub-phase to satisfy a preset reflected power or to cause a reflected coefficient to satisfy a preset reflected coefficient.

Preferably, the method further includes the following steps:

receiving an input RF frequency of the pulse modulation RF signal of the overshoot sub-phase and using the input RF frequency as a preset frequency; and adjusting the RF frequency of the pulse modulation RF signal of the overshoot sub-phase to the preset frequency.

Preferably, adjusting the RF frequency of the pulse modulation RF signal of the overshoot sub-phase includes using a sweep frequency matching algorithm to automatically adjust the RF frequency of the pulse modulation RF signal of the overshoot sub-phase.

Preferably, the preset reflected coefficient is less than 0.5.

Preferably, the preset reflected coefficient is less than 0.2.

Preferably, a power range of the pulse modulation RF signal of the overshoot sub-phase is 0.5-1 time of a maximum output power of the RF power supply.

Preferably, the power range of the pulse modulation RF signal of the overshoot sub-phase is 0.8-1 time of the maximum output power of the RF power supply.

Preferably, a time length of the overshoot sub-phase is less than or equal to 10% of a time length of the pulse-on phase; and/or a pulse modulation frequency range of the pulse modulation RF signal is from 10 Hz to 100 KHz, and a duty cycle range is from 10% to 90%.

A third aspect of the present disclosure further provides a reaction chamber, including a plasma generation device, an RF power supply, and a pulse modulation system. The pulse modulation system is electrically connected to the RF power supply and the plasma generation device and configured to provide a pulse modulation RF signal to the plasma generation device. The pulse modulation system includes any pulse modulation system described above.

DETAILED DESCRIPTION OF THE EMBODIMENTS

To make those skilled in the art to understand a technical solution of the present disclosure, a pulse modulation system and method of a radio frequency (RF) power supply provided by the present disclosure are described in detail in connection with accompanying drawings.

Before the description of the pulse modulation system and method of the RF power supply and the reaction chamber provided by the present disclosure, the technical problem of "in some cases, even the overshoot power is loaded enough, and the overshoot time is long enough, the successful ignition is difficult to realize" is analyzed first. Although high overshoot power (3000 W) is loaded at the moment the pulse is on, due to the impedance characteristic in an ignition phase, most of the power (1500 W) is reflected. Although the overshoot power is high, only a part of the power (about 1500 W) is effectively applied to an electrode for the pulse ignition. Therefore, it is difficult to guarantee the success of the pulse ignition.

Embodiment 1

Figure 1:
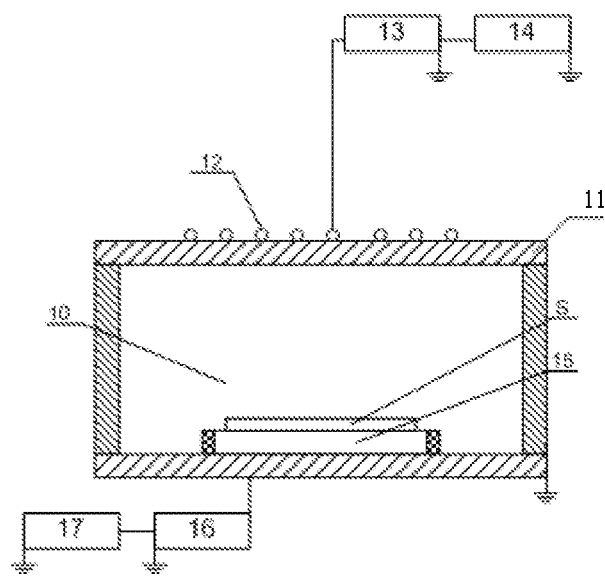
FIG. 1 is a schematic diagram of an inductively coupled plasma (ICP) equipment according to some embodiments of the present disclosure.
Figure 2:
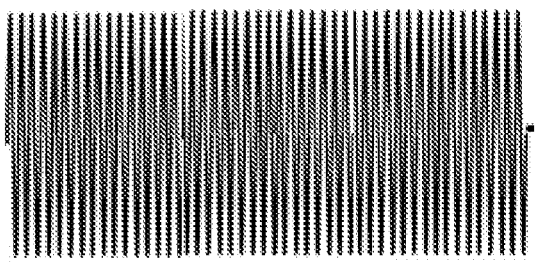
FIG. 2 is a schematic diagram showing a wave shape of a continuous radio frequency (RF) signal according to some embodiments of the present disclosure.
Figure 3:
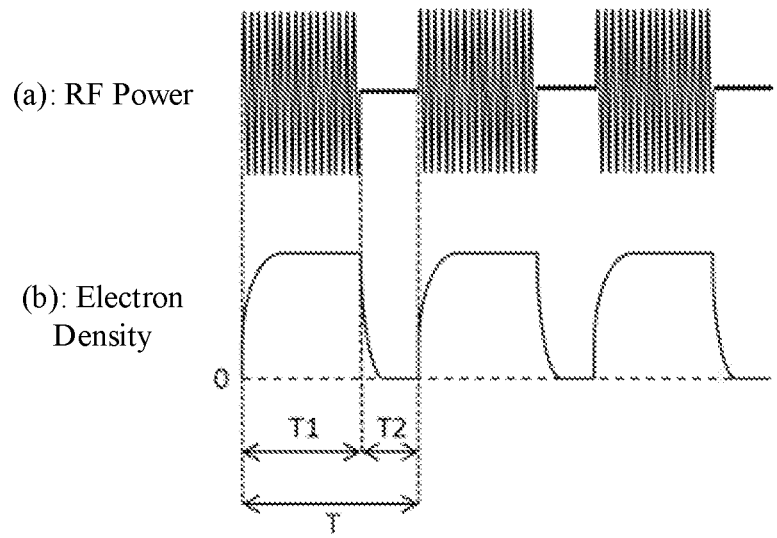
FIG. 3 is a schematic diagram showing a wave shape of an ideal pulse modulation RF signal according to some embodiments of the present disclosure.
Figure 4:
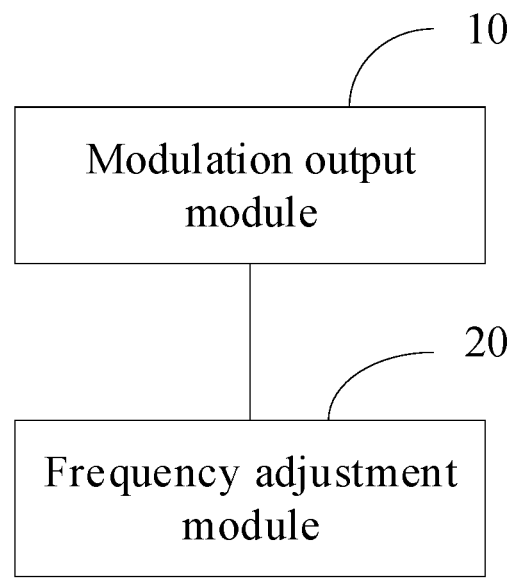
FIG. 4 is a schematic principle block diagram of a pulse modulation system of an RF power supply according to some embodiments of the present disclosure.

FIG. 4 is a schematic principle block diagram of a pulse modulation system of an RF power supply according to some embodiments of the present disclosure. As shown in FIG. 4, the pulse modulation system of the RF power supply provided by embodiments of the present disclosure includes a modulation output module 10 and a frequency adjustment module 20. The modulation output module 10 may be configured to modulate an output signal of the RF power supply and output the pulse modulation RF signal. Each pulse cycle of the pulse modulation RF signal includes a pulse-on phase and a pulse-off phase. An overshoot sub-phase is set in the initial preset time of the pulse-on phase.

The frequency adjustment module 20 is electrically connected to the modulation output module 10. The frequency adjustment module 20 may be configured to modulate the RF frequency of the pulse modulation RF signal in the overshoot sub-phase to cause a reflected power to satisfy a preset reflected power or a reflected coefficient to satisfy a preset reflected coefficient.

In some embodiments, by adjusting the RF frequency of the pulse modulation RF signal in the overshoot sub-phase, the reflected power may satisfy the preset reflected power, or the reflected coefficient may satisfy the preset reflected coefficient. As such, most of the overshoot power may be loaded to the RF electrode of a plasma generation device to easily realize a successful ignition. In this case, requirements for the overshoot power and the preset time of the overshoot sub-phase may be lowered. Therefore, the ignition may be successfully realized with low overshoot power and short preset time. Hence, the damage to the RF system may be greatly reduced, and a design requirement of the RF system and the cost may be reduced.

It needs to be noted that the value of the initial preset time is not restricted. Those of skill in the art may determine the time of the overshoot sub-phase in the pulse-on phase.

It needs to be further noted that the preset reflected power or the preset reflected coefficient may not be restricted. Those skilled in the art may determine the preset reflected power or the preset reflected coefficient according to the actual needs. The determined preset reflected power or the preset reflected coefficient should ensure that an effective power loaded to the RF electrode may ignite successfully.

Preferably, the frequency adjustment module 20 may use a sweep frequency matching algorithm to automatically adjust the RF frequency of the pulse modulation RF signal in the overshoot sub-phase. That is, the frequency adjustment module 20 may use an automatic sweep frequency to obtain optimal impedance matching in the overshoot sub-phase, which is a smallest reflected power. By using the automatic sweep frequency to obtain the optimal impedance matching, the method may save time and effort and is convenient.

Preferably, the inventor performs a plurality of experiments and discovers that when the reflected coefficient is less than 0.5, most of the power may be loaded to the RF electrode of the plasma device, which is easier for the pulse ignition to succeed.

Further preferably, the inventor performs a further reduction experiment on the preset reflection coefficient and discovers that when the reflected coefficient is less than 0.2, the power may be loaded to the RF electrode of the plasma device as much as possible to further ensure the pulse ignition to succeed in a short time.

Preferably, a power range of the pulse modulation RF signal of the overshoot sub-phase may be 0.5-1 time of maximum output power of the RF power supply to increase a possibility for the plasma ignition to succeed.

Further preferably, the power range of the pulse modulation RF signal in the overshoot sub-phase may be 0.8-1 time of the maximum output power of the RF power supply to further increase the possibility for the plasma ignition to succeed.

The power range of the pulse modulation RF signal in the overshoot sub-phase may be other ranges in addition to the above ranges.

Preferably, the time length of the overshoot sub-phase is less than or equal to 10% of the time length of the pulse-on phase, and/or the pulse modulation frequency range of the pulse modulation RF signal may be from 10 Hz to 100 KHz, and a duty cycle range is from 10% to 90% to increase the possibility for the plasma ignition to succeed.

Figure 5:
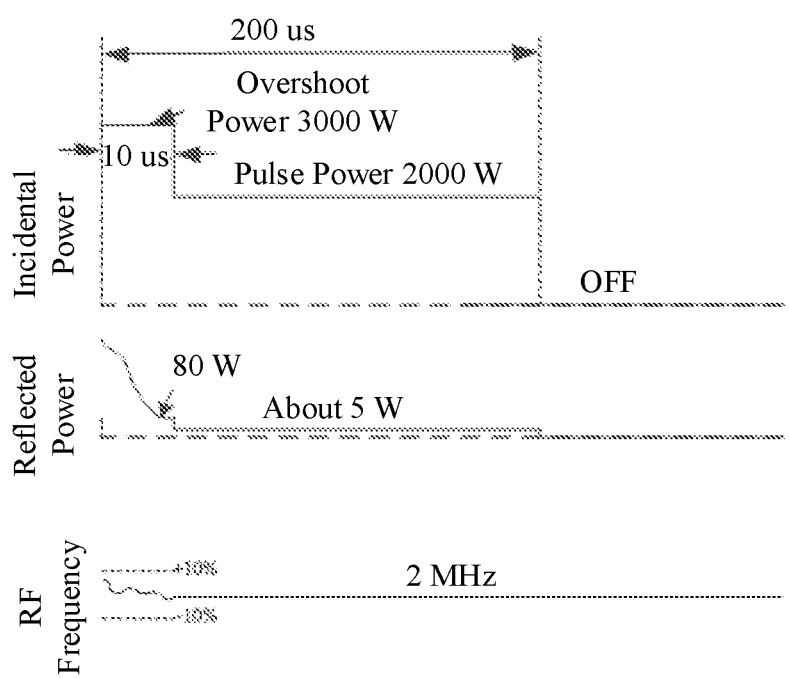
FIG. 5 is a schematic diagram of a wave shape of the RF frequency of incident power, a reflected power, and a system output according to some embodiments of the present disclosure.

The pulse modulation system of the RF power supply provided by embodiments of the present disclosure is described in connection with FIG. 5. In some embodiments, the pulse modulation system of the RF power supply provided by embodiments of the present disclosure is connected to an upper modulation electrode plate of the CCP plasma generation device. The CCP plasma generation device may be configured as a base of a lower electrode plate to be grounded. A center frequency of the RF power system is 2 MHz, which is adjusted in a range of 2±10% MHz, and the maximum output power is 5000 W. In some other embodiments, the RF frequency of the RF signal is 2 MHz, and the RF power of the RF signal is less than or equal to 3000 W, for example, 2000 W, and the time length of the pulse-on phase is 200 us. The preset time length of the overshoot sub-phase is 10 us, and the overshoot power of the overshoot sub-phase is 3000 W.

Based on the above, in the overshoot sub-phase, the frequency adjustment module 20 may use the sweep frequency matching algorithm to automatically adjust the frequency of the pulse modulation RF signal of the overshoot sub-phase. As such, the minimum reflected power corresponding to the optimal impedance matching may be achieved. As shown in FIG. 5, the reflected power in the overshoot sub-phase is only 80 W, and the reflected power at other times of the pulse-on phase is only 5 W. Therefore, the power of 3000 W−80 W=2920 W in the overshoot sub-phase is loaded to the electrode plate so as to ensure the ignition to succeed.

The pulse modulation system of the RF power supply of embodiments of the present may be connected to the CCP plasma generation device to generate the plasma. In some embodiments, the pulse modulation system of the RF power supply may also be connected to other types of plasma generation devices, such as an ICP plasma generation device, etc.

Embodiment 2

Figure 6:
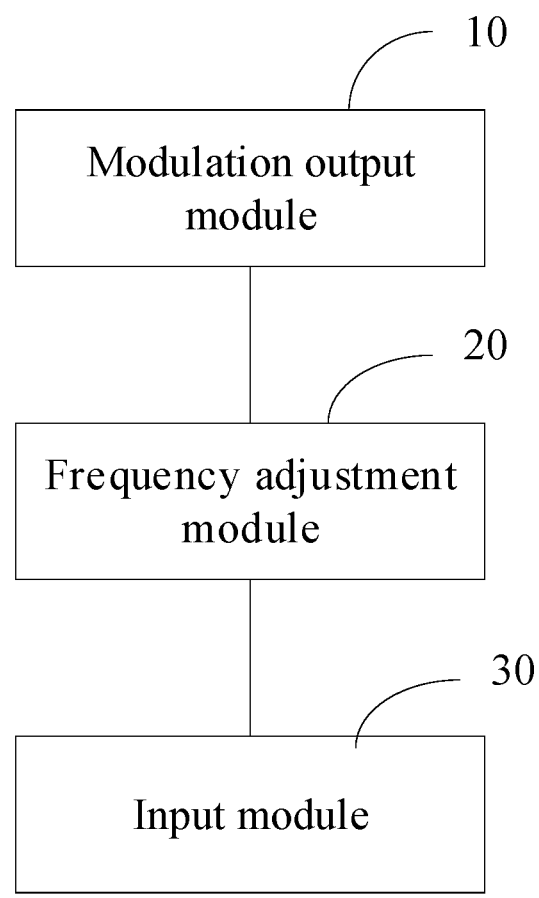
FIG. 6 is a schematic principle block diagram of another pulse modulation system of an RF power supply according to some embodiments of the present disclosure.

FIG. 6 is a schematic principle block diagram of another pulse modulation system of an RF power supply according to some embodiments of the present disclosure. As shown in FIG. 6, compared to the above-described pulse modulation system of the RF power supply, the pulse modulation system of the RF power supply of embodiments of the present disclosure also includes the modulation output module 10 and the frequency adjustment module 20, which are described in detail in the above embodiment and are not repeated here.

The only difference between the present embodiment and the above embodiment 1 is described. Specifically, as shown in FIG. 6, the pulse modulation system further includes an input module 30. The input module 30 is electrically connected to the frequency adjustment module 20. The input module 30 may be configured to receive the input RF frequency of the pulse modulation RF signal in the overshoot sub-phase and send the input RF to the frequency adjustment module 20 as a preset frequency. The frequency adjustment module 20 may be further configured to adjust the RF frequency of the pulse modulation RF signal in the overshoot sub-phase as the preset frequency.

It can be understood that the difference between the present embodiment and the above embodiment is that the preset frequency may be set manually. The preset frequency may be a frequency for the reflected power of the pulse modulation RF signal in the overshoot sub-phase to satisfy the preset reflected power and the reflected coefficient of the pulse modulation RF signal in the overshoot sub-phase to satisfy the preset reflected coefficient.

In some embodiments, the input module 30 may be but not limited to a keyboard, an audio receiver, etc.

In some embodiments, the RF frequency of the RF signal may be 13.56 MHz, the power of the RF signal may be less than or equal to 1500 W, and the time length of the pulse-on phase may be 500 us. The preset time length of the overshoot sub-phase is 5 us. The power of the pulse modulation RF signal in the overshoot sub-phase may be 2000 W. The frequency of the pulse modulation RF signal in the overshoot sub-phase may be 13.42 MHz.

Figure 7:
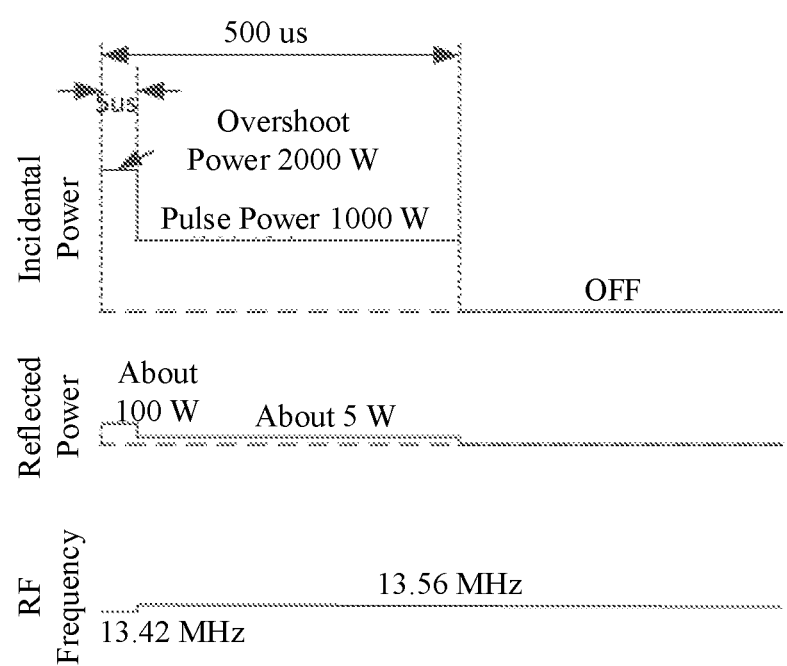
FIG. 7 is a schematic diagram of a wave shape of the RF of incident power, a reflected power, and a system output according to some embodiments of the present disclosure.

The pulse modulation system of the RF power supply provided by embodiments of the present disclosure is described in connection with FIG. 7. In some embodiments, the pulse modulation system of the RF power supply is connected to an inductor coil of the ICP plasma generation device. The ICP plasma generation device may be configured as a base of a lower electrode plate to connect to the continuous wave RF power supply. The RF center frequency of the RF power supply is 13.56 MHz and is adjusted in the range of 13.56±5% MHz, and the maximum output power is 3000 W. In some embodiments, the RF frequency of the RF signal is 13.56 MHz, the power of the RF signal is less than or equal to 1500 W, which is 1000 W, and the time length of the pulse-on phase is 500 us. The preset time length of the overshoot sub-phase is 5 us. The power of the pulse modulation RF signal in the overshoot sub-phase is 2000 W. The frequency (i.e., the above-described preset frequency) of the pulse modulation RF signal in the overshoot sub-phase is 13.42 MHz.

Before an operation, the frequency of the pulse modulation RF signal in the overshoot sub-phase, which is input by the input module 30, is 13.42 MHz. As shown in FIG. 7, the reflected power in the overshoot sub-phase is only 100 W, and the reflected power at other times in the pulse-on phase is only 5 W, hence, the power loaded to the inductor coil in the overshoot sub-phase is 2000 W−100 W=1900 W. As such, the ignition may easily succeed.

It is noted that the pulse modulation system of the RF power supply may be connected to the ICP plasma generation device to generate the plasma. In some other embodiments, the pulse modulation system of the RF power supply may be connected to other types of plasma generation devices, such as the CCP plasma generation device.

It needs to be further noted that the center frequencies of the pulse modulation system of the RF power supply of the above embodiments may be 2 MHz and 13.56 MHz, respectively, or other frequencies, such as 400 KHz, 27.12 MHz, 40 MHz, 60 MHz, 80 MHz, 100 MHz, etc.

Embodiment 3

The present disclosure also provides a reaction chamber. The reaction chamber may include a plasma generation device, an RF power supply, and a pulse modulation system. The pulse modulation system may be electrically connected to the RF power supply and the plasma generation device. The pulse modulation system may be configured to provide a pulse modulation RF signal to the plasma generation device. The pulse modulation system may use the pulse modulation system provided in embodiment 1 or embodiment 2.

Specifically, the plasma generation device may be the ICP plasma generation device and include the inductor coil and the base configured to load a wafer. At least one of the inductor coil or the base may be connected to the pulse modulation system.

In addition, in some other embodiments, the plasma generation device may be the CCP plasma generation device and include an upper electrode plate and a base as a lower electrode plate. At least one of the upper electrode plate or the base may be connected to the pulse modulation system.

The reaction chamber provided by embodiments of the present disclosure may use the pulse modulation system provided in embodiment 1 or embodiment 2. Hence, the ignition may be easy to succeed, the design requirement of the RF system may be lowered, and the cost is reduced.

Embodiment 4

Embodiments of the present disclosure further provide a pulse modulation method of the RF power supply, which includes outputting the pulse modulation RF signal. Each pulse cycle of the pulse modulation RF signal may include the pulse-on phase and the phase-off phase. The overshoot sub-phase may be set in an initial preset time of the pulse-on phase.

The method further includes, when outputting the pulse modulation RF signal, adjusting the RF frequency of the pulse modulation RF signal in the overshoot sub-phase to cause the reflected power in the overshoot sub-phase to satisfy the preset reflected power or the reflected coefficient to satisfy the preset reflected coefficient.

In the present disclosure, by adjusting the RF frequency of the pulse modulation RF signal in the overshoot sub-phase to cause the reflected power to satisfy the preset reflected power or the reflected coefficient to satisfy the preset reflected coefficient. That is, most of the overshoot power may be loaded to the RF electrode of the plasma generation device for the ignition to easily succeed. In this case, the requirements for the overshoot power and the preset time of the overshoot sub-phase may be lowered. As such, the ignition may succeed with lower overshoot power and shorter preset time. Therefore, the damage to the RF system may be greatly reduced, the design requirement for the RF system may be lowered, and the cost may be reduced.

Figure 8:
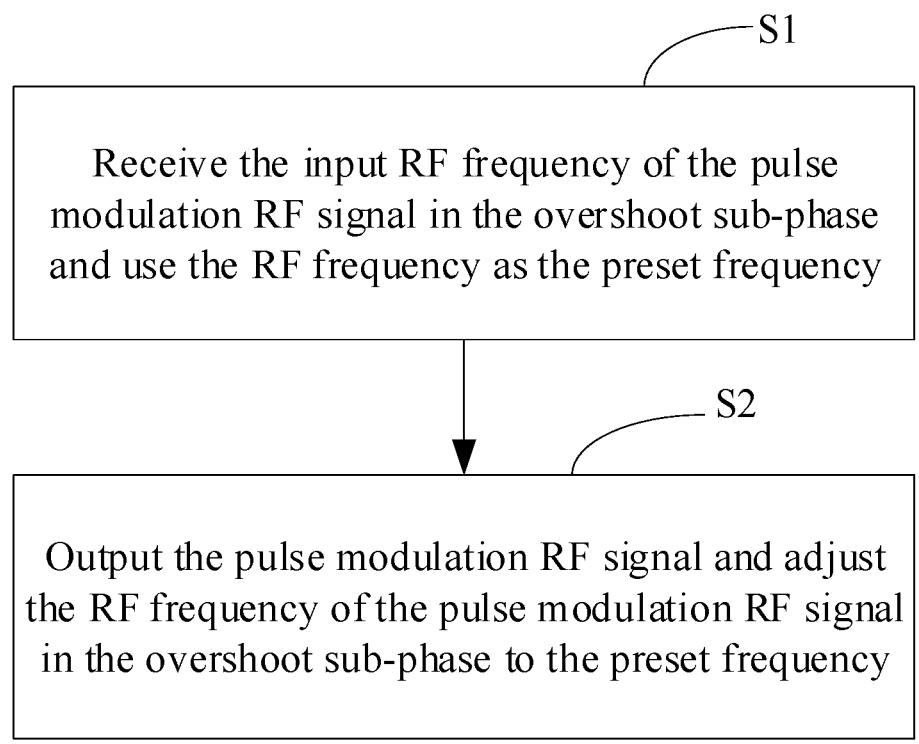
FIG. 8 is a schematic flowchart of a pulse modulation method of the RF power supply according to some embodiments of the present disclosure.

FIG. 8 is a schematic flowchart of a pulse modulation method of the RF power supply according to some embodiments of the present disclosure. The method includes:

at S1, receiving the input RF frequency of the pulse modulation RF signal in the overshoot sub-phase and using the RF frequency as the preset frequency; and at S2, outputting the pulse modulation RF signal and adjusting the RF frequency of the pulse modulation RF signal in the overshoot sub-phase to the preset frequency.

FIG. 8 shows the pulse modulation method, which allows the preset frequency to be set manually. The preset frequency may be a frequency for the reflected power of the pulse modulation RF signal in the overshoot sub-phase to satisfy the preset reflected power and the reflected coefficient of the pulse modulation RF signal in the overshoot sub-phase to satisfy the preset reflected coefficient.

Preferably, the reflected coefficient may be less than 0.5. In some other embodiments, the reflected coefficient may be less than 0.2.

Preferably, the power range of the pulse modulation RF signal in the overshoot sub-phase may be 0.5-1 times of the maximum output power. In some other embodiments, the power range of the pulse modulation RF signal in the overshoot sub-phase may be 0.8-1 times of the maximum output power.

Preferably, the time length of the overshoot sub-phase is less than or equal to 10% of the time length of the pulse-on phase, and/or the pulse modulation power range of the pulse modulation RF signal may be from 10 Hz to 100 KHz, and the duty cycle range is from 10% to 90%.

Preferably, although the preset frequency may be adjusted manually, the present disclosure is not limited to this. In some other embodiments, adjusting the RF frequency of the pulse modulation RF signal of the overshoot sub-phase may further include using the sweep frequency matching algorithm to automatically adjust the RF frequency of the pulse modulation RF signal in the overshoot sub-phase. The above-described embodiments are merely exemplary embodiments to describe the principle of the present disclosure, and the present disclosure is not limited to these embodiments. For those skilled in the art, without departing from the spirit and essence of the present disclosure, various modifications and improvements may be made, and these modifications and improvements are within the scope of the present disclosure.

What is claimed is:

1. A pulse modulation system of a radio frequency (RF) power supply, comprising:
    a modulation output circuit configured to modulate a signal from the RF power supply to provide modulation RF signal and output the modulation RF signal in a pulse form to provide a pulse modulation RF signal, each pulse cycle of the pulse modulation RF signal including a pulse-on phase with pulse-modulated RF signal and a pulse-off phase without pulse-modulated RF signal, and
    a power overshoot sub-phase being set in an initial preset time of the pulse-on phase of each pulse cycle; and
    a frequency adjustment circuit electrically connected to the modulation output circuit, the frequency adjustment circuit being configured to adjust an RF frequency of the pulse modulation RF signal of the power overshoot sub-phase, according to a preset frequency, to cause a reflected power of the power overshoot sub-phase to satisfy a preset reflected power or to cause a reflected coefficient to satisfy a preset reflected coefficient.

2. The pulse modulation system of the RF power supply of claim 1, further comprising an input circuit, wherein:
    the input circuit is electrically connected to the frequency adjustment circuit;
    the input circuit is configured to receive an input RF frequency of the pulse modulation RF signal of the power overshoot sub-phase and send the input RF frequency to the frequency adjustment circuit as the preset frequency; and
    the frequency adjustment circuit is configured to adjust the RF frequency of the pulse modulated RF signal of the power overshoot sub-phase to the preset frequency.

3. The pulse modulation system of the RF power supply of claim 1, wherein the frequency adjustment circuit is configured to use a sweep frequency matching algorithm to automatically adjust the RF frequency of the pulse modulation RF signal of the power overshoot sub-phase.

4. The pulse modulation system of the RF power supply of claim 1, wherein the preset reflected coefficient is less than 0.5.

5. The pulse modulation system of the RF power supply of claim 4, wherein the preset reflected coefficient is less than 0.2.

6. The pulse modulation system of the RF power supply of claim 1, wherein a power range of the pulse modulation RF signal of the power overshoot sub-phase is 0.5-1 time of a maximum output power of the RF power supply.

7. The pulse modulation system of the RF power supply of claim 6, wherein the power range of the pulse modulation RF signal of the power overshoot sub-phase is 0.8-1 time of the maximum output power of the RF power supply.

8. The pulse modulation system of the RF power supply of claim 1, wherein:
    a time length of the power overshoot sub-phase is less than or equal to 10% of a time length of the pulse-on phase; and/or
    a pulse modulation frequency range of the pulse modulation RF signal is from 10 Hz to 100 KHz, and a duty cycle range is from 10% to 90%.

9. A pulse modulation method of an RF power supply, comprising:
    outputting a pulse modulation RF signal, each pulse cycle of the pulse modulation RF signal including a pulse-on phase with pulse-modulated RF signal and a pulse-off phase without pulse-modulated RF signal, and a power overshoot sub-phase being set in an initial preset time of the pulse-on phase of each pulse cycle; and
    when outputting the pulse modulation RF signal, adjusting, according to a preset frequency, an RF frequency of the pulse modulation RF signal of the power overshoot sub-phase to cause a reflected power of the overshoot sub-phase to satisfy a preset reflected power or to cause a reflected coefficient to satisfy a preset reflected coefficient.

10. The pulse modulation method of the RF power supply of claim 9, further comprising:
    receiving an input RF frequency of the pulse modulation RF signal of the overshoot sub-phase and using the input RF frequency as the preset frequency; and
    adjusting the RF frequency of the pulse modulation RF signal of the overshoot sub-phase to the preset frequency.

11. The pulse modulation method of the RF power supply of claim 9, wherein adjusting the RF frequency of the pulse modulation RF signal of the overshoot sub-phase includes:
    using a sweep frequency matching algorithm to automatically adjust the RF frequency of the pulse modulation RF signal of the power overshoot sub-phase.

12. The pulse modulation method of the RF power supply of claim 9, wherein the preset reflected coefficient is less than 0.5.

13. The pulse modulation method of the RF power supply of claim 12, wherein the preset reflected coefficient is less than 0.2.

14. The pulse modulation method of the RF power supply of claim 9, wherein a power range of the pulse modulation RF signal of the power overshoot sub-phase is 0.5-1 time of a maximum output power of the RF power supply.

15. The pulse modulation method of the RF power supply of claim 14, wherein the power range of the pulse modulation RF signal of the power overshoot sub-phase is 0.8-1 time of the maximum output power of the RF power supply.

16. The pulse modulation method of the RF power supply of claim 9, wherein:
    a time length of the power overshoot sub-phase is less than or equal to 10% of a time length of the pulse-on phase; and/or a pulse modulation frequency range of the pulse modulation RF signal is from 10 Hz to 100 KHz, and a duty cycle range is from 10% to 90%.

17. A reaction chamber, comprising:
a plasma generation device;
an RF power supply; and
a pulse modulation system, electrically connected to the RF power supply and the plasma generation device and configured to provide a pulse modulation RF signal to the plasma generation device, the pulse modulation system including:
   a modulation output circuit configured to modulate a signal from the RF power supply to provide modulation RF signal and output the modulation RF signal in a pulse form to provide a pulse modulation RF signal, each pulse cycle of the pulse modulation RF signal including a pulse-on phase with pulse-modulated RF signal and a pulse-off phase without pulse-modulated RF signal, and a power overshoot sub-phase being set in an initial preset time of the pulse-on phase of each pulse cycle; and
   a frequency adjustment circuit electrically connected to the modulation output circuit, the frequency adjustment circuit being configured to adjust an RF frequency of the pulse modulation RF signal of the power overshoot sub-phase, according to a preset frequency, to cause a reflected power of the power overshoot sub-phase to satisfy a preset reflected power or to cause a reflected coefficient to satisfy a preset reflected coefficient.

18. The reaction chamber of claim 17, further comprising an input circuit, wherein:
   the input circuit is electrically connected to the frequency adjustment circuit;
   the input circuit is configured to receive an input RF frequency of the pulse modulation RF signal of the overshoot sub-phase and send the input RF frequency to the frequency adjustment circuit as the preset frequency; and
   the frequency adjustment circuit is configured to adjust the RF frequency of the pulse modulated RF signal of the power overshoot sub-phase to the preset frequency.

19. The reaction chamber of claim 17, wherein the frequency adjustment circuit is configured to use a sweep frequency matching algorithm to automatically adjust the RF frequency of the pulse modulation RF signal of the power overshoot sub-phase.

* * * * *